US009893050B2

(12) United States Patent
Laine et al.

(10) Patent No.: US 9,893,050 B2
(45) Date of Patent: Feb. 13, 2018

(54) ESD PROTECTION STRUCTURE

(71) Applicant: Freescale Semiconductor, Inc., Austin, TX (US)

(72) Inventors: Jean Philippe Laine, France (FR); Patrice Besse, Tournefeuille (FR)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 14/953,711

(22) Filed: Nov. 30, 2015

(65) Prior Publication Data
US 2017/0005081 A1 Jan. 5, 2017

(30) Foreign Application Priority Data

Jun. 30, 2015 (WO) ............... PCT/IB2015/001563

(51) Int. Cl.
*H01L 29/66* (2006.01)
*H01L 27/02* (2006.01)
*H01L 29/74* (2006.01)
*H01L 29/06* (2006.01)

(52) U.S. Cl.
CPC ...... *H01L 27/0255* (2013.01); *H01L 29/0653* (2013.01); *H01L 29/66371* (2013.01); *H01L 29/7416* (2013.01)

(58) Field of Classification Search
CPC .......... H01L 27/0292; H01L 29/66106; H01L 29/66371; H01L 29/66386; H01L 29/66393; H01L 29/747
USPC ......... 257/111, 112, 362, 551; 438/380, 414, 438/417
See application file for complete search history.

(56) References Cited

U.S. PATENT DOCUMENTS

| | | | |
|---|---|---|---|
| 5,359,211 A | 10/1994 | Croft | |
| 5,530,612 A | 6/1996 | Maloney | |
| 5,576,557 A | 11/1996 | Ker et al. | |
| 5,751,042 A | 5/1998 | Yu | |
| 5,932,915 A | 8/1999 | Park | |
| 6,011,681 A | 1/2000 | Ker et al. | |
| 6,441,437 B1 * | 8/2002 | Gossner | ............. H01L 27/0248 257/355 |
| 6,707,110 B2 | 3/2004 | De Heyn et al. | |
| 6,882,011 B1 | 4/2005 | Chen | |
| 7,327,541 B1 | 2/2008 | Wang et al. | |
| 7,427,787 B2 | 9/2008 | Steinhoff | |

(Continued)

OTHER PUBLICATIONS

Gossner et al., "Wide Range Control of the Sustaining Voltage of ESD Protection Elements Realized in a Smart Power Technology," IEEE EOS/ESD Symposium; Sep. 28-30, 1999; 9 pages.

(Continued)

*Primary Examiner* — Chandra Chaudhari

(57) ABSTRACT

An ESD protection structure comprising a thyristor structure. The thyristor structure is formed from a first P-doped section comprising a first P-doped well formed within a first region of a P-doped epitaxial layer, a first N-doped section comprising a deep N-well structure, a second P-doped section comprising a second P-doped well formed within a second region of the epitaxial layer, and a second N-doped section comprising an N-doped contact region formed within a surface of the second P-doped well. The ESD protection structure further comprises a P-doped region formed on an upper surface of the deep N-well structure and forming a part of the second P-doped section of the thyristor structure.

14 Claims, 4 Drawing Sheets

(56) References Cited

U.S. PATENT DOCUMENTS

| | | | |
|---|---|---|---|
| 7,659,558 B1 | 2/2010 | Walker et al. | |
| 7,768,068 B1 | 8/2010 | Jang et al. | |
| 7,786,507 B2 | 8/2010 | Denison et al. | |
| 7,888,703 B2 * | 2/2011 | Albers | H01L 27/0262 257/173 |
| 8,390,092 B2 | 3/2013 | Gendron et al. | |
| 8,476,736 B2 * | 7/2013 | Lee | H01L 27/0255 257/547 |
| 2004/0135141 A1 | 7/2004 | Pequignot et al. | |
| 2008/0088993 A1 | 4/2008 | Entringer et al. | |
| 2008/0203534 A1 | 8/2008 | Xu et al. | |
| 2009/0045457 A1 | 2/2009 | Bobde | |
| 2009/0057833 A1 | 3/2009 | Renaud et al. | |
| 2009/0195944 A1 | 8/2009 | Goyal et al. | |
| 2009/0213506 A1 | 8/2009 | Zhan et al. | |
| 2009/0273867 A1 | 11/2009 | Whitfield et al. | |
| 2010/0019341 A1 | 1/2010 | Gill et al. | |
| 2010/0127305 A1 | 5/2010 | Renaud et al. | |
| 2010/0187608 A1 | 7/2010 | Risaki et al. | |
| 2010/0320501 A1 | 12/2010 | Gendron et al. | |
| 2011/0175198 A1 | 7/2011 | Zhan et al. | |
| 2011/0176243 A1 | 7/2011 | Zhan et al. | |
| 2011/0176244 A1 | 7/2011 | Gendron et al. | |
| 2012/0133025 A1 | 5/2012 | Clarke et al. | |
| 2014/0061716 A1 | 3/2014 | Zhan et al. | |
| 2014/0225156 A1 | 8/2014 | Zhan et al. | |

OTHER PUBLICATIONS

Vashchencko, V.A. et al., "Dual-direction Isolated NMOS-SCR Device for System Level ESD Protection," National Semiconductor, IEEE EST Symposium, 5 pages; Sep. 2006.

* cited by examiner

US 9,893,050 B2

1

ESD PROTECTION STRUCTURE

FIELD OF THE INVENTION

This invention relates to an ESD protection structure, and in particular to a bidirectional ESD protection structure.

BACKGROUND OF THE INVENTION

Integrated circuit (IC) devices are prone to electrostatic discharge (ESD) events, whereby external contacts of the IC devices are subjected to large electrical charges (positive or negative). Functional circuitry within an IC device is required to be protected from electrical currents created by such large electrical charges at the external contacts of the IC devices, which can cause erroneous behavior within the functional circuitry and even permanently damage the functional circuitry due to the magnitude of the electrical currents that can be generated by ESD events.

To protect the functional circuitry of an IC device from ESD events, it is known to provide susceptible external contacts of the IC device with ESD protection structures. Conventional ESD protection structures typically include thyristor structures (i.e. P-N-P-N semiconductor structures) coupled between an external contact to be protected, such as an input/output (I/O) contact of the IC device, and a power supply contact (e.g. ground or Vss) to which ESD currents are to be shunted.

Many applications require bidirectional ESD protection to be provided for at least some of the external contacts of an IC device, for example +40V positive ESD protection and, say −2V or −5V negative ESD protection. Conventionally, a high voltage NPNB (bidirectional N-P-N) ESD structure is used to provide the positive (+40V) ESD protection. However, such a conventional high voltage NPNB ESD structure arranged to provide, say, +40V ESD protection is typically only able to achieve a minimum negative ESD protection of, say, −13V to −15V. Accordingly, in order to achieve negative ESD protection of a lesser magnitude than −13V, for example in the region of −2V to −5V, it is necessary to provide a separate negative ESD structure in parallel with the high voltage NPNB ESD structure.

However, the footprint of ESD protection structures at the external contacts of IC devices is a significant limiting factor in the minimum die size that can be achieved. Accordingly, the need for two separate ESD structures to be used to provide such bidirectional ESD protection is undesirable as it increases the die size of the IC device.

SUMMARY OF THE INVENTION

The present invention provides an ESD protection structure, an integrated circuit device comprising an ESD structure, and a method of fabricating such an ESD protection structure as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

In accordance with some examples of the present invention, there is provided an electrostatic discharge protection structure having a thyristor structure arranged to provide ESD protection during a negative ESD event. A P-doped region is formed on an upper surface of a deep N-well collector of the thyristor structure, and forms a part of the collector-base junction of the thyristor structure. The inclusion of the P-doped region formed on the upper surface of the deep N-well collector reduces the breakdown voltage of the collector-base junction of the thyristor structure, thereby enabling a lower negative ESD protection to be achieved than with conventional ESD protection structures. In particular, the inclusion of the P-doped region formed on the upper surface of the deep N-well collector enables a single bidirectional ESD protection structure to achieve negative ESD protection of a lesser magnitude than −13V, for example in the region of −2V to −5V, along with, say, +40V positive ESD protection, thereby alleviating the need for a separate negative ESD structure to be provided in parallel with a high voltage NPNB ESD structure.

Significantly, and as outlined in greater detail below, conventionally no such p-doped region is provided within the upper surface of the deep N-well collector. Consequently, the breakdown voltage of the collector-base junction of the thyristor structure is conventionally controlled by the concentrations of and distance between the common collector N-doped DPN structure 140 and the respective P-doped wells 150, 152. As a result, the minimal breakdown voltage obtained for a conventional high voltage NPNB ESD structure is restricted to between 13 and 15V (in either positive or negative polarity).

Figure 1:
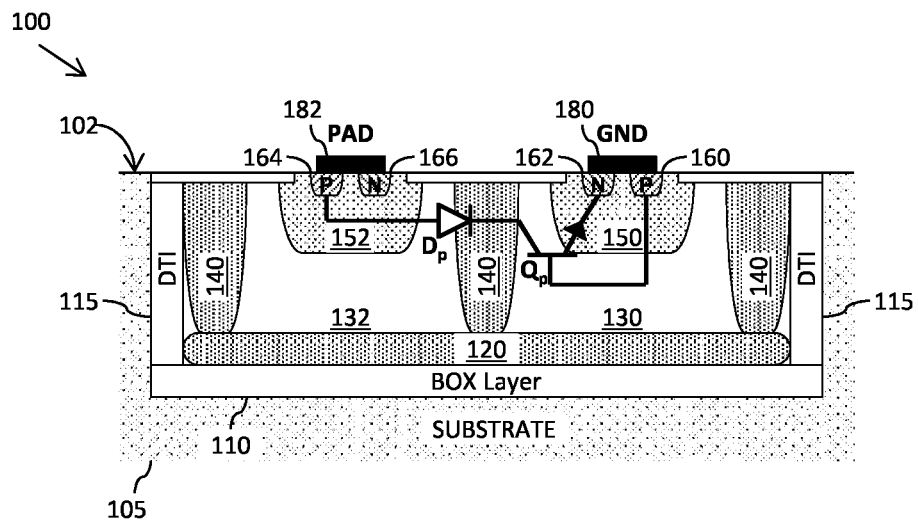
FIGS. 1 and 2 schematically illustrate a conventional NPNB ESD protection structure formed within a semiconductor substrate.
Figure 2:
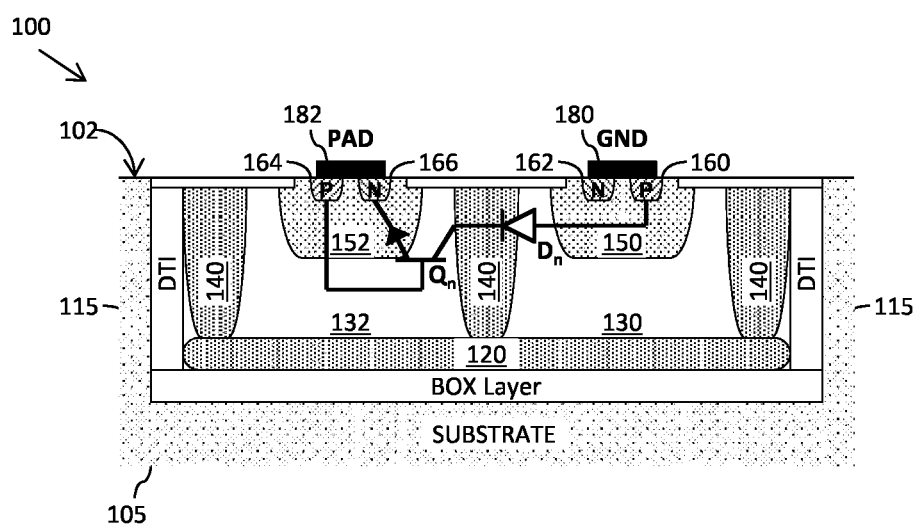

FIGS. 1 and 2 schematically illustrate a conventional NPNB ESD protection structure 100 formed within a semiconductor substrate 105. The NPNB ESD protection structure 100 illustrated in FIGS. 1 and 2 includes a P-doped epitaxial layer divided into two regions 130, 132 by a deep N-well (DPN) structure 140.

P-doped wells 150, 152 are formed within the upper surfaces of the two P-doped regions 130, 132 of the epitaxial layer. The use of the term 'upper surface' used herein is intended to refer to a surface of a region or structure (e.g. a P-doped well 150, 152 in this scenario) that is substantially co-planar with a surface 102 of the semiconductor substrate 105 within which the NPNB ESD structure 100 is formed.

P-doped contact regions 160, 164 are formed within the upper surfaces of the P-doped wells 150, 152. N-doped contact regions 162, 166 are also formed within the upper surfaces of the P-doped wells 150, 152.

A metalized contact layer 180 is formed over the P-doped contact region 160 and the N-doped contact region 162 within the upper surface of the P-doped well 150 of the first region 130 of the epitaxial layer, and arranged to be electrically coupled to a power supply contact (e.g. ground or Vss) to which ESD currents are to be shunted.

A metalized contact layer 182 is formed over the P-doped contact region 164 and the N-doped contact region 166 within the upper surface of the P-doped well 152 of the second region 132 of the epitaxial layer, and arranged to be electrically coupled to a contact of the IC device to be protected, such as an input/output (I/O) contact.

A first P-N-P-N thyristor structure is formed within the NPNB ESD protection structure 100, and is arranged to provide ESD protection during a positive ESD event, whereby a large positive charge is injected into the (I/O) contact to be protected (coupled to the metalized contact layer 182). The first P-N-P-N thyristor structure is formed from:
  the second P-doped region 132 of the epitaxial layer, the P-doped well 152 and the P-doped contact region 164;
  the N-doped DPN structure 140 (between the first and second P-doped regions 130, 132 of the epitaxial layer);
  the first P-doped region 130 of the epitaxial layer and the P-doped well 150; and
  the N-doped contact region 162.

During a positive ESD event whereby a large positive charge is injected into the (I/O) contact to be protected (coupled to the metalized contact layer 182), the P-N-P-N thyristor structure creates a diode $D_p$ and NPN bipolar transistor $Q_p$ circuit, as illustrated in FIG. 1. In an ideal circuit, the large positive ESD charge injected into the contact to be protected creates a large voltage drop across the collector-base junction of the NPN bipolar transistor $Q_p$ (i.e. the junction between the N-doped DPN structure 140, forming the collector of the NPN bipolar transistor $Q_p$, and the first P-doped region 130, forming the base of the NPN bipolar transistor $Q_p$) that exceeds the breakdown voltage of the transistor $Q_p$. This results in a breakdown of the collector-base junction of the NPN bipolar transistor $Q_p$, and causes the NPN bipolar transistor $Q_p$ to go into a snapback mode of operation whereby a large current is able to flow there through, enabling the large positive ESD charge to be shunted from the contact to be protected (coupled to the metalized contact layer 182), through the diode $D_p$ and transistor $Q_p$, to a power supply contact (e.g. GND in the illustrated example) coupled to the metalized contact 180.

A second P-N-P-N thyristor structure is formed within the NPNB ESD protection structure 100, and is arranged to provide ESD protection during a negative ESD event, whereby a large negative charge is injected into the (I/O) contact to be protected. The second P-N-P-N thyristor structure is formed from:
  the first P-doped region 130 of the epitaxial layer, the P-doped well 150 and the P-doped contact region 160;
  the N-doped DPN structure 140 (between the first and second P-doped regions 130, 132 of the epitaxial layer);
  the second P-doped region 132 of the epitaxial layer and the P-doped well 152; and
  the N-doped contact region 166.

During a negative ESD event whereby a large negative charge is injected into the (I/O) contact to be protected (coupled to the metalized contact layer 182), the P-N-P-N thyristor structure creates a diode $D_n$ and NPN bipolar transistor $Q_n$ circuit, as illustrated in FIG. 2. The large negative ESD charge injected into the contact to be protected creates a large voltage drop across the collector-base junction of the NPN bipolar transistor $Q_n$ (i.e. the junction between the N-doped DPN structure 140 and the second P-doped region 132) that exceeds the breakdown voltage of the transistor $Q_n$. This results in a breakdown of the collector-base junction of the NPN bipolar transistor $Q_n$, and causes the NPN bipolar transistor $Q_n$ to go into a snapback mode of operation whereby a large current is able to flow there through, enabling the large negative ESD charge to be shunted from the (I/O) contact to be protected, through the diode $D_n$ and transistor $Q_n$, to a power supply contact (e.g. GND in the illustrated example) coupled to the metalized contact 180.

The breakdown voltage of each of the transistors $Q_p$ and $Q_n$ is determined by the characteristics of their respective collector-base junctions. In particular, the breakdown voltage of each of the transistors $Q_p$ and $Q_n$ is primarily dependent on the relationship between the N-doped DPN structure 140 between the first and second P-doped regions 130, 132 of the epitaxial layer, which forms a common collector for the transistors $Q_p$ and $Q_n$, and the respective P-doped well 150, 152, which typically has a much higher dopant concentration than the epitaxial layer. The breakdown voltage of each of the transistors $Q_p$ and $Q_n$ may be controlled by way of the dopant concentrations, as well as through the distance between the common collector N-doped DPN structure 140 and the respective P-doped well 150, 152.

However, a conventional high voltage NPNB ESD structure arranged to provide, say, +40V ESD protection is typically only able to achieve a minimum negative ESD protection of, say, −13V to −15V. As previously explained, the concentrations of and distance between the common collector N-doped DPN structure 140 and the respective P-doped wells 150, 152 controls the breakdown voltage of the transistors $Q_p$ and $Q_n$. As this distance tends to zero, the minimal breakdown voltage obtained for a conventional high voltage NPNB ESD structure is between 13 and 15V (in either positive or negative polarity).

Figure 3:
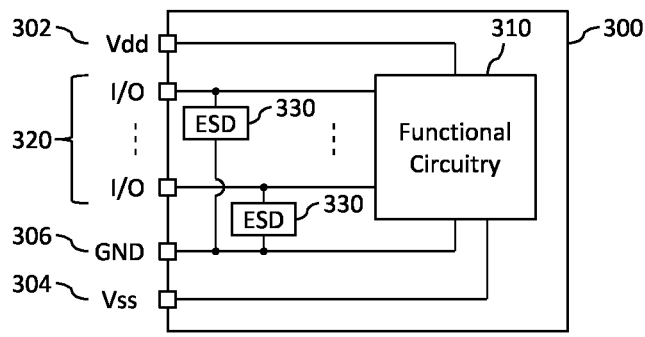
FIG. 3 illustrates a simplified block diagram of an example of an integrated circuit (IC) device.

Referring now to FIG. 3, there is illustrated a simplified block diagram of an example of an integrated circuit (IC) device 300. The IC device 300 includes functional circuitry 310 for providing the intended functionality of the IC device 300. Such functional circuitry 310 may include one or more of, for example:
  combinational logic circuits such as one or more Boolean logic circuits;
  sequential logic circuits;
  processing cores;
  memory elements;
  clock generator circuits;
  power management units;
  interconnect components such as a system bus, crossbar switch or the like;
  etc.

The IC device 300 further includes power supply contacts arranged to be coupled to external power supply sources. Three such power supply contacts 302, 304, 306 are illustrated in FIG. 3 for simplicity: one positive voltage power supply contact Vdd 302; one negative voltage power supply contact Vss 304; and one ground supply contact GND 306. However, it will be appreciated that the IC device 300 may include multiple positive or negative voltage power supply contacts 302, 304, as well as multiple ground supply contacts 306. The IC device 300 further includes at least one contact required to be protected from ESD events, such as the input/output (I/O) contacts 320 illustrated in FIG. 3. The IC device 300 further includes at least one ESD protection component 330 coupled between each of the contacts 320 required to be protected from ESD events and at least one of the power supply contacts 302, 304.

Figure 4:
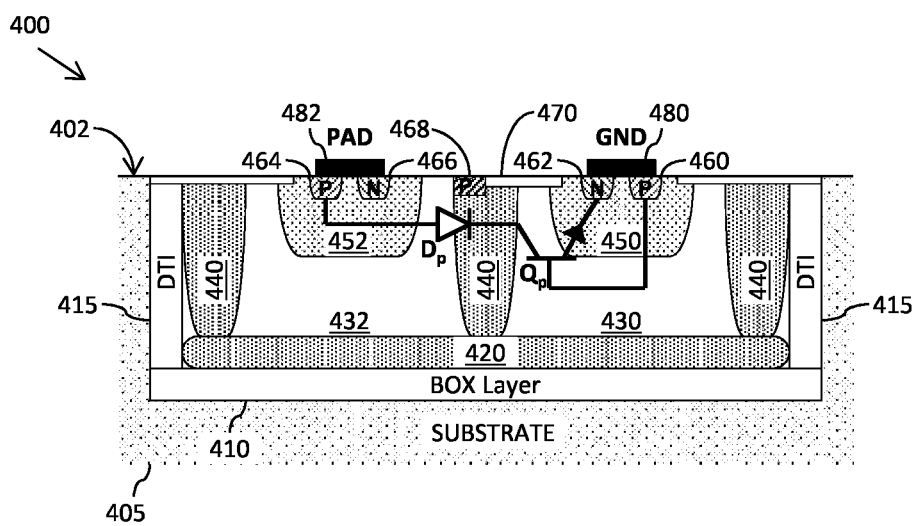
FIGS. 4 and 5 schematically illustrate an ESD protection structure formed within a semiconductor substrate.
Figure 5:
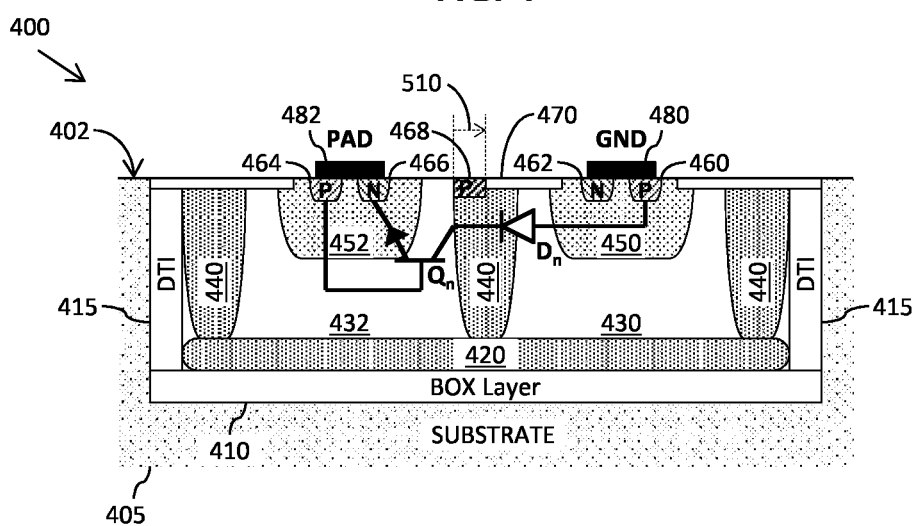

FIGS. 4 and 5 schematically illustrate an ESD protection structure 400 according to some examples of the present invention, formed within a semiconductor substrate 405, such as may be implemented to provide the ESD protection components 330 of the IC device 300 illustrated in FIG. 3. In the example illustrated in FIGS. 4 and 5, the ESD protection structure 400 is a bidirectional NPN (NPNB) ESD structure.

The ESD protection structure 400 illustrated in FIGS. 4 and 5 is enclosed within an isolation trench, which isolates the ESD protection structure 400 from the substrate 405. The isolation trench is formed by a buried oxide (BOX) layer 410 forming the 'floor' of the isolation trench, and deep trench isolation (DTI) structures 415 forming the 'walls' of the isolation trench.

The ESD protection structure 400 illustrated in FIGS. 4 and 5 includes a P-doped epitaxial layer divided into two regions 430, 432 by a deep N-well (DPN) structure 440. The DPN structure 440 is further formed such that it laterally encloses each of the two P-doped regions 430, 432, creating a floating N-doped structure not connected to any reference potential.

In the illustrated example the ESD protection structure 400 further includes an N-doped buried layer (NBL) 420, formed to isolate first and second semiconductor regions 430, 432 of the epitaxial layer from the floor (i.e. the BOX layer 410) of the isolation trench within which the ESD protection structure 400 is contained.

In the example illustrated in FIGS. 4 and 5, the (silicon) substrate layer 405, (insulator) BOX layer 410 and (silicon) epitaxial/NBL layers 420 form a silicon on insulator (SOI) layered structure (silicon-insulator-silicon). The BOX layer 420 (and the NBL 420 in the illustrated example) provide vertical (from the cross-sectional perspective illustrated in FIGS. 4 and 5) isolation between the P-doped regions 430, 432 of the epitaxial layer and the substrate 405. The DPN structure 440 and the DTI structures 415 provide lateral isolation between the individual regions 430, 432 of the epitaxial layer, and between the (P-doped) regions 430, 432 of the epitaxial layer and the (N-doped) substrate 405.

P-doped wells 450, 452 are formed within the two P-doped regions 430, 432 of the epitaxial layer. P-doped contact regions 460, 464 are formed within upper surfaces of the P-doped wells 450, 452. N-doped contact regions 462, 466 are also formed within the upper surfaces of the P-doped wells 450, 452. The use of the term 'upper surface' used herein is intended to refer to a surface of a region or structure (e.g. a P-doped well 450, 452 in this scenario) that is substantially co-planar with a surface 402 of the semiconductor substrate 405 within which the ESD structure 400 is formed.

A metalized contact layer 480 is formed over the P-doped contact region 460 and the N-doped contact region 462 within the upper surface of the P-doped well 450 of the first region 430 of the epitaxial layer. The metalized contact layer 480 is arranged to be electrically coupled to a power supply contact (e.g. ground in the illustrated example) to which ESD currents are to be shunted.

A metalized contact layer 482 is formed over the P-doped contact region 464 and the N-doped contact region 466 within the upper surface of the P-doped well 452 of the second region 432 of the epitaxial layer. The metalized contact layer 482 is arranged to be electrically coupled to a contact of the IC device to be protected, such as an input/output (I/O) contact 320 illustrated in FIG. 3.

In some examples, the P-doped wells 450, 452 and the DPN structure 440 may have a higher dopant concentration than the epitaxial layer, whilst the contact regions 460, 462, 464, 466 may have a still higher dopant concentration than the P-doped wells 450, 452 and the DPN structure 440.

A first thyristor (P-N-P-N) structure is formed within the ESD protection structure 400, and is arranged to provide ESD protection during a negative ESD event, whereby a large negative charge is injected into the (I/O) contact to be protected. The first thyristor structure is formed from:

a first P-doped section coupled to the power supply contact (GND in the illustrated example) to which ESD currents are to be shunted, the first P-doped section including the P-doped well 450 formed within the first P-doped region 430 of the epitaxial layer, and the P-doped contact region 460;

a first N-doped section forming a collector node of the first thyristor structure, the first N-doped section including the part of the DPN structure 440 between the first and second P-doped regions 430, 432 of the epitaxial layer;

a second P-doped section including the second P-doped well 452 formed within the second P-doped region 432 of the epitaxial layer; and a second N-doped section coupled to the (I/O) contact to be protected, the second N-doped section including the N-doped contact region 466.

In the illustrated example, the ESD protection structure further includes a P-doped region 468 formed on an upper surface of the part of the DPN structure 440 forming the collector node of the first thyristor structure.

As illustrated in FIGS. 4 and 5, the P-doped region 468 formed on the upper surface of the DPN structure 440 is in contact with the second P-doped region 432 of the epitaxial layer, and in this manner forms a part of the second P-doped section of the first thyristor structure.

In the example illustrated in FIGS. 4 and 5, an isolation region 470 is formed on the upper surface of the DPN structure 440 and arranged to isolate the P-doped region 468 formed on the upper surface of the DPN structure 440 from the first region 430 of the epitaxial layer, and thus from the second P-doped section of the thyristor structure. Such an isolation region 470 may be formed by way of, say, a shallow trench isolation region.

During a negative ESD event whereby a large negative charge is injected into the contact to be protected (coupled to the metalized contact layer 482), the first thyristor structure creates a diode $D_n$ and NPN bipolar transistor $Q_n$ circuit, as illustrated in FIG. 5. The large negative ESD charge injected into the contact to be protected creates a large voltage drop across the collector-base junction of the NPN bipolar transistor $Q_n$ (i.e. the junction between the N-doped DPN structure 440 and the second P-doped region 432). If a sufficiently large negative ESD charge is injected into the contact to be protected, the breakdown voltage of the transistor $Q_n$ will be exceeded, resulting in a breakdown of the collector-base junction of the transistor $Q_n$. Such a breakdown of the collector-base junction of the transistor $Q_n$ causes the transistor $Q_n$ to go into a snapback mode of operation whereby a large current is able to flow there through, enabling the large negative ESD charge to be shunted from the (I/O) contact to be protected, through the diode $D_n$ and transistor $Q_n$, to the power supply contact coupled to the metalized contact 480 (e.g. GND in the illustrated example).

The P-doped region 468 formed on the upper surface of the DPN structure 440 creates a Zener tunnelling diode type junction that facilitates the tunnelling of electrons from the valence band of the P-type material (i.e. the P-doped region 468) to the conduction band of the N-type material (i.e. the N-doped DPN structure 440). By facilitating the tunnelling of electrons in this manner, the breakdown voltage of the transistor $Q_n$ is reduced as compared with the conventional ESD protection structure illustrated in FIGS. 1 and 2.

As a result, the ESD protection structure 400 illustrated in FIGS. 4 and 5 is able to achieve negative ESD protection of a lesser magnitude than the −13V limit achievable by the conventional ESD protection structure illustrated in FIGS. 1 and 2, even when providing positive ESD protection in the region of +40V.

In some examples, the P-doped region 468 formed on the upper surface of the DPN structure 440 has a high dopant concentration, and in particular a higher dopant concentration than the epitaxial layer. In some embodiments, the P-doped region 468 may have a higher dopant concentration than the P-doped wells 450 and 452. For example, the P-doped region 468 may have a dopant concentration of more than 1e17 at/cm3, and up to 1e20 at/cm3. By forming the P-doped region 468 on the upper surface of the DPN structure 440 with a high dopant concentration, the tunnelling of electrons from the valence band of the P-type material (i.e. the P-doped region 468) to the conduction band of the N-type material (i.e. the N-doped DPN structure 440) may be further facilitated.

The breakdown voltage of the transistor $Q_n$ may be further varied by varying the extent to which the P-doped region 468 extends across the upper surface of the part of the DPN structure 440 forming the collector node of the first thyristor structure, as indicated at 510 in FIG. 5. The further the P-doped region 468 extends 510 across the upper surface of the part of the DPN structure 440, the lower the breakdown voltage of the transistor $Q_n$, and thus the lower the negative ESD protection achievable. In this manner, by varying the extent to which the P-doped region 468 extends 510 across the upper surface of the part of the DPN structure 440, a desired negative ESD protection voltage of a lesser magnitude than the −13V limit achievable by the conventional ESD protection structure illustrated in FIGS. 1 and 2 may be achieved, such as, say, −2V, −5V, etc.

For completeness, a second thyristor structure is formed within the ESD protection structure 400, and is arranged to provide ESD protection during a positive ESD event, whereby a large positive charge is injected into the (I/O) contact to be protected. The second thyristor structure is formed from:
  a first P-doped section coupled to the (I/O) contact to be protected, the first P-doped section including the P-doped well 452 formed within the second P-doped region 432 of the epitaxial layer, and the P-doped contact region 464;
  a first N-doped section forming a (common) collector node of the second thyristor structure, the first N-doped section including the part of the DPN structure 440 between the first and second P-doped regions 430, 432 of the epitaxial layer;
  a second P-doped section including the first P-doped well 450 formed within the first P-doped region 430 of the epitaxial layer; and
  a second N-doped section coupled to the power supply contact (GND in the illustrated example) to which ESD currents are to be shunted, the second N-doped section including the N-doped contact region 462.

During a positive ESD event whereby a large positive charge is injected into the contact to be protected (coupled to the metalized contact layer 482), the second thyristor structure creates a diode $D_p$ and NPN bipolar transistor $Q_p$ circuit, as illustrated in FIG. 4. The large positive ESD charge injected into the contact to be protected creates a large voltage drop across the collector-base junction of the NPN bipolar transistor $Q_p$ (i.e. the junction between the N-doped DPN structure 440 and the first P-doped region 430). If a sufficiently large positive ESD charge is injected into the contact to be protected, the breakdown voltage of the transistor $Q_p$ will be exceeded, resulting in a breakdown of the collector-base junction of the transistor $Q_p$. Such a breakdown of the collector-base junction of the transistor $Q_p$ causes the transistor $Q_p$ to go into a snapback mode of operation whereby a large current is able to flow there through, enabling the large positive ESD charge to be shunted from the (I/O) contact to be protected, through the diode $D_p$ and transistor $Q_p$, to the power supply contact coupled to the metalized contact 480 (e.g. GND in the illustrated example).

Figure 6:
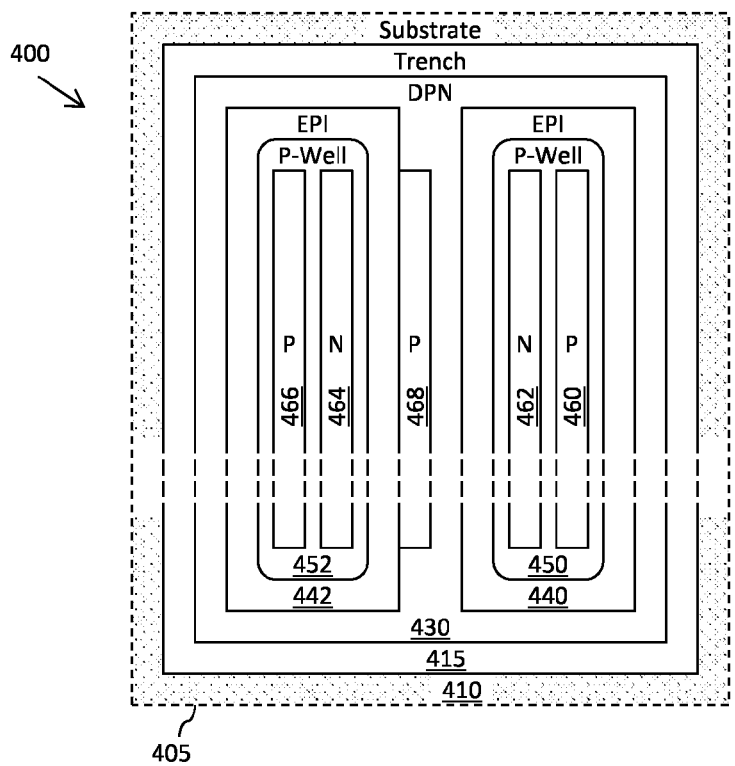
FIG. 6 schematically illustrates a plan view of the ESD protection structure of FIGS. 4 and 5.

FIG. 6 schematically illustrates a plan view of the ESD protection structure 400 of FIGS. 4 and 5. As can be seen more clearly from FIG. 6, the contact regions 460, 462, 464, 466, 468 and P-doped wells 450, 452 consist of long, narrow formations running in parallel within the ESD protection structure 400.

Figure 7:
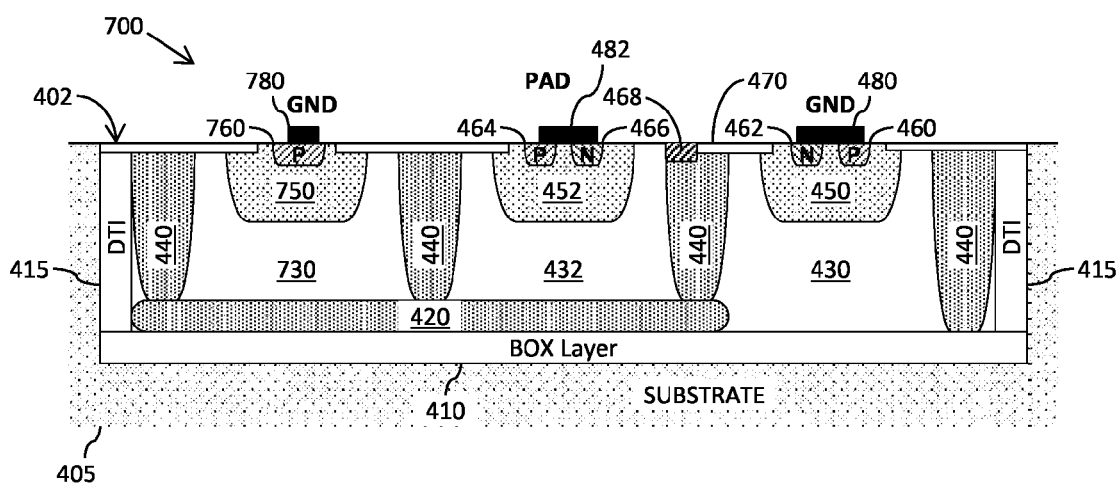
FIG. 7 schematically illustrates a simplified cross-sectional view of an example of an alternative ESD protection structure.

It will be appreciated that the present invention is not limited to the specific ESD protection structure 400 illustrated in FIGS. 4 to 6, and it is contemplated that the present invention may be implemented within various alternative ESD protection structures. FIG. 7 schematically illustrates a simplified cross-sectional view of an example of an alternative ESD protection structure 700 within which the present invention has been implemented. For ease of understanding, like features have been assigned like reference numerals within FIG. 7 as within FIGS. 4 to 6.

In the example illustrated in FIG. 7, the DPN structure 440 is formed within the P-doped epitaxial layer, dividing the epitaxial layer into three regions 430, 432, 730. The DPN structure 440 is formed such that it laterally encloses (and isolates) each of the three regions 430, 432, 730 of the epitaxial layer, creating a floating N-doped structure not connected to any reference potential. The NBL 420 is arranged such that it encloses the bottom of two of the regions 432, 730, isolating the two regions 432, 730 from the buried oxide (BOX) layer 410.

P-doped wells 450, 452, 750 are formed within the P-doped regions 430, 432, 730 of the epitaxial layer. P-doped contact regions 460, 464, 760 are formed within upper surfaces of the P-doped wells 450, 452, 750. N-doped contact regions 462, 466 are also formed within the upper surfaces of the P-doped wells 450, 452.

A metalized contact layer 480 is formed over the P-doped contact region 460 and the N-doped contact region 462 within the upper surface of the P-doped well 450 of the first region 430 of the epitaxial layer. The metalized contact layer 480 is arranged to be electrically coupled to a power supply contact (e.g. ground in the illustrated example) to which ESD currents are to be shunted.

A metalized contact layer 482 is formed over the P-doped contact region 464 and the N-doped contact region 466 within the upper surface of the P-doped well 452 of the second region 432 of the epitaxial layer. The metalized contact layer 482 is arranged to be electrically coupled to a contact of the IC device to be protected, such as an input/output (I/O) contact 320 illustrated in FIG. 3.

A metalized contact layer 780 is formed over the P-doped contact region 760 within the upper surface of the P-doped well 750 of the third region 730 of the epitaxial layer. The metalized contact layer 780 is arranged to be electrically coupled to power supply contact (e.g. ground in the illustrated example) to which ESD currents are to be shunted.

A first thyristor (P-N-P-N) structure is formed within the ESD protection structure 700, and is arranged to provide ESD protection during a negative ESD event, whereby a large negative charge is injected into the contact to be protected. The first thyristor structure is formed from:

a first P-doped section coupled to the power supply contact (GND in the illustrated example) to which ESD currents are to be shunted, the first P-doped section including the P-doped well 450 formed within the first P-doped region 430 of the epitaxial layer, and the P-doped contact region 460;

a first N-doped section forming a collector node of the first thyristor structure, the first N-doped section including the part of the DPN structure 440 between the first and second P-doped regions 430, 432 of the epitaxial layer;

a second P-doped section including the second P-doped well 452 formed within the second P-doped region 432 of the epitaxial layer; and a second N-doped section coupled to the contact to be protected, the second N-doped section including the N-doped contact region 466.

In the illustrated example, the ESD protection structure further includes a P-doped region 468 formed on an upper surface of the part of the DPN structure 440 forming the collector node of the first thyristor structure.

As illustrated in FIG. 7, the P-doped region 468 formed on the upper surface of the DPN structure 440 is in contact with the second P-doped region 432 of the epitaxial layer, and in the manner forms a part of the second P-doped section of the first thyristor structure.

An isolation region 470 is formed on the upper surface of the DPN structure 440 and arranged to isolate the P-doped region 468 formed on the upper surface of the DPN structure 440 from the first region 430 of the epitaxial layer, and thus from the second P-doped section of the thyristor structure. Such an isolation region 470 may be formed by way of, say, a shallow trench isolation region.

Figure 8:
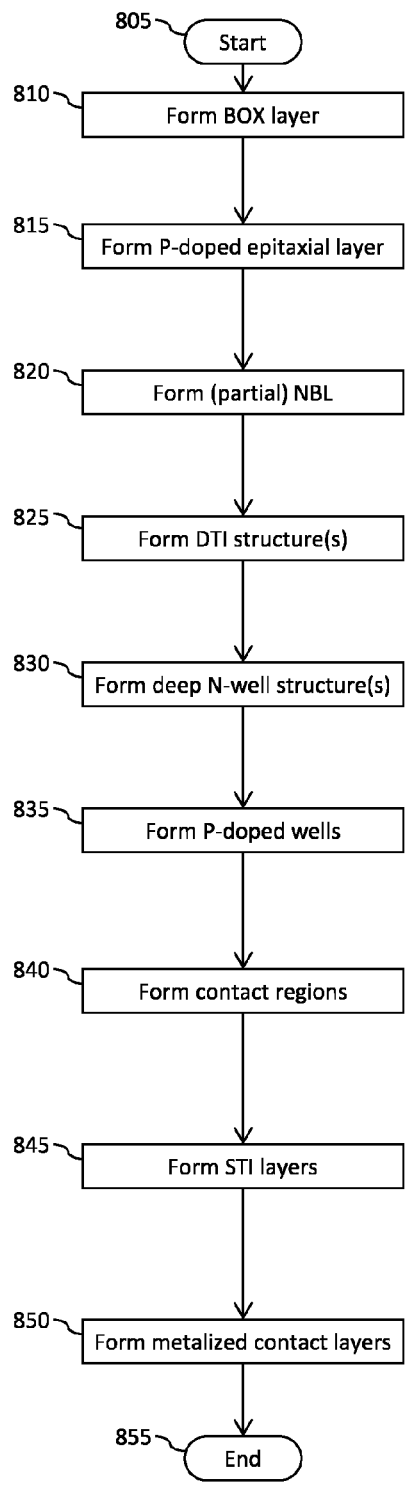
FIG. 8 illustrates a simplified flowchart of an example of a method of fabricating an ESD protection structure within a semiconductor substrate of an integrated circuit device.
Figure 8:
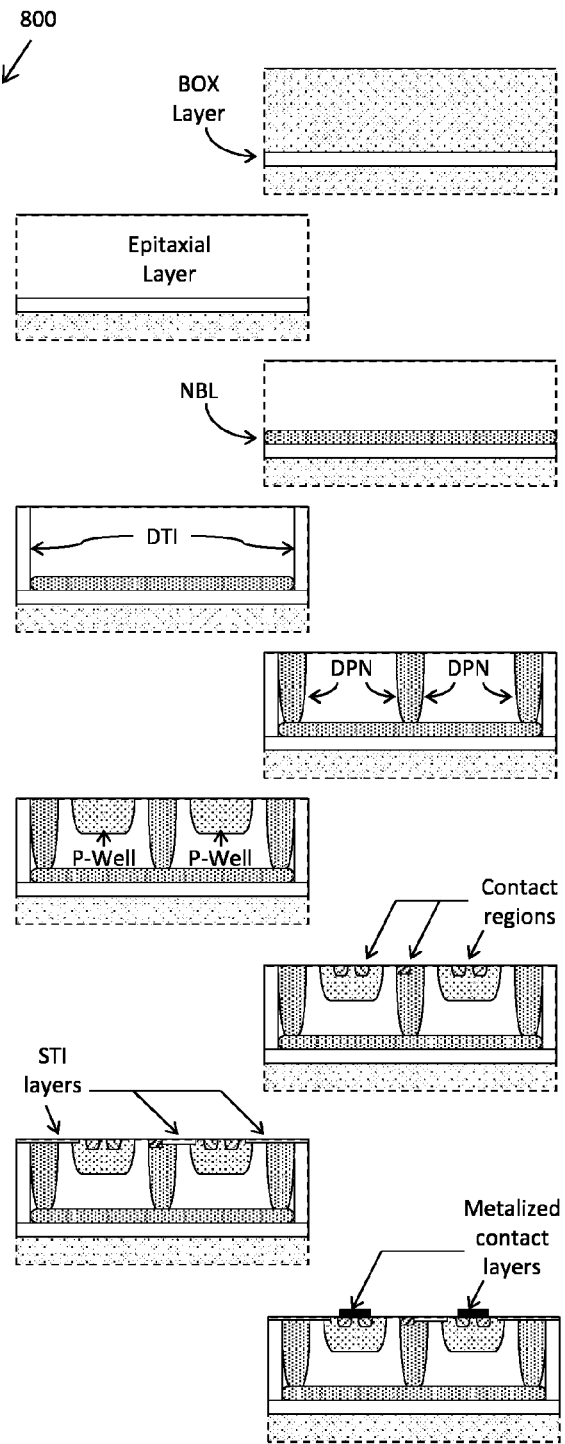

Referring now to FIG. 8, there is illustrated a simplified flowchart 800 of an example of a method of fabricating an ESD protection structure within a semiconductor substrate of an integrated circuit device, such as the ESD protection structures 400, 700 illustrated in FIGS. 4 to 7. It is to be understood that the simplified flowchart 800 illustrated in FIG. 8 is intended to illustrate general procedures to be performed during the fabrication of the integrated circuit device in order to form the structural components required to implement some examples of the present invention. However, as will be understood by a skilled person, the fabrication process of an integrated circuit device is typically more complex than the simplified flowchart 800 illustrated in FIG. 8, with several of the general procedures illustrated requiring multiple fabrication procedures to be performed at different stages of the fabrication process, and with the implementation of some of the general procedures illustrated in FIG. 8 at least partly overlapping. Furthermore, it will be appreciated that the specific order of the procedures illustrated in FIG. 8 is not intended to be limiting, and the various structural components may be formed in any appropriate order.

The fabrication process illustrated in FIG. 8 starts at 805 and includes the formation of a BOX (buried oxide) layer within the semiconductor substrate, at 810, to provide a floor of an isolation trench within which the ESD protection structure is contained, such as the BOX layers 410 in FIGS. 4 to 7. One known technique for forming the BOX Layer is by way of a Separation by Implantation of Oxygen (SIMOX) process which uses an oxygen ion beam implantation process followed by high temperature annealing to create a buried SiO2 layer. Alternatively, the BOX layer may be formed by way of wafer bonding, whereby an insulating layer is formed by directly bonding oxidized silicon with a second substrate.

An epitaxial layer is formed within the semiconductor substrate over the BOX layer, at 815, for example by way of a vapor-phase epitaxy process.

An N-doped buried layer (NBL), such as the NBLs 420 illustrated in FIGS. 4 to 7, is formed on top of the BOX layer, at 820, for example by way of an N-type dopant implantation procedure. In some examples, the NBL may be a partial N-doped buried layer, whereby a region of the epitaxial layer remains in contact with the BOX layer.

One or more deep trench isolation (DTI) structures are formed, at 825, to provide walls of the isolation trench, for example by way of etching a pattern of the required DTI structure(s) in the semiconductor substrate, depositing one or more dielectric materials (such as silicon dioxide) to fill the trenches, and removing the excess dielectric using a technique such as chemical-mechanical planarization.

One or more deep N-well (DPN) structure(s) is/are formed, at 830, to divide the epitaxial layer into multiple P-doped regions laterally isolated from one another by the DPN structure(s).

In the example illustrated in FIG. 8, P-doped wells are formed within exposed (upper) surfaces of the P-doped regions of the epitaxial layer, at 835, for example by way of a P-type dopant implantation or diffusion procedure.

Contact regions may then be formed within exposed (upper) surfaces of the P-doped wells, for example by way of one or more dopant implantation or diffusion procedure(s). In particular, an P-doped contact region is formed within a surface of a P-doped well within a first P-doped region of the epitaxial layer and an N-doped contact region is formed within a surface of a P-doped well within a second, adjacent P-doped region of the epitaxial layer such that a thyristor structure is formed within the ESD protection structure, the thyristor structure being formed from:

a first P-doped section arranged to be coupled to a power supply contact to which ESD currents are to be shunted, the first P-doped section including the P-doped well formed within the first P-doped region of the epitaxial layer, and the P-doped contact region;

a first N-doped section forming a collector node of the thyristor structure, the first N-doped section including a part of the DPN structure between the first and second P-doped regions of the epitaxial layer;

a second P-doped section including the P-doped well formed within the second P-doped region of the epitaxial layer; and a second N-doped section arranged to be coupled to a contact to be protected, the second N-doped section including the N-doped contact region formed within the surface of the P-doped well formed within the second P-doped region of the epitaxial layer.

A P-doped region is also formed on an upper surface of the part of the DPN structure forming the collector node of the first thyristor structure, in contact with the second P-doped region of the epitaxial layer and thus forming a part of the second P-doped section of the first thyristor structure.

Shallow trench isolation (STI) layers are formed on the surface of the ESD protection structure, at 845, such that the contact regions within the P-doped wells are left exposed. In some examples, a shallow trench isolation layer is formed over at least a part of the upper surface of the part of the DPN structure(s) forming the second N-doped layer of the thyristor structure between the first and second regions of the epitaxial layer, and arranged to isolate the P-doped region formed on the upper surface of the DPN structure from the first region of the epitaxial layer.

Metalized contact layers are formed over at least some of the exposed contact regions, at 850.

The fabrication process illustrated in FIG. 8 ends at 855.

The present invention has been described with reference to particular dopant-types; i.e. regions and structures being either P-doped or N-doped. However, it will be appreciated that the present invention is not limited to the particular dopant arrangements hereinbefore described and as illustrated in the accompanying drawings, and in some alternative examples it is contemplated that the dopant types may be reversed.

Furthermore, because the illustrated embodiments of the present invention may for the most part, be implemented using fabrication processes and procedures known to those skilled in the art, details of such processes and procedures have not been explained in any greater extent than that considered necessary for the understanding and appreciation of the underlying concepts of the present invention and in order not to obfuscate or distract from the teachings of the present invention.

It is to be understood that the term "or" used herein is to be interpreted either exclusively or inclusively, depending upon which is broader in terms of the context.

In the foregoing specification, the invention has been described with reference to specific examples of embodiments of the invention. It will, however, be evident that various modifications and changes may be made therein without departing from the scope of the invention as set forth in the appended claims and that the claims are not limited to the specific examples described above.

For example, the semiconductor substrate described herein can be any semiconductor material or combinations of materials, such as gallium arsenide, silicon germanium, silicon-on-insulator (SOI), silicon, monocrystalline silicon, the like, and combinations of the above.

Moreover, the terms 'front,' 'back,' 'top,' 'bottom,' 'over,' 'under' and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The words 'comprising' and 'including' do not exclude the presence of other elements or steps then those listed in a claim. Furthermore, the terms 'a' or 'an,' as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an.' The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

We claim:

1. An electrostatic discharge, ESD, protection structure formed within a semiconductor substrate of an integrated circuit device, the ESD protection structure comprising:
   at least a first thyristor structure being formed from
      a first P-doped section comprising a first P-doped well formed within a first region of a P-doped epitaxial layer, wherein the first P-doped section is coupled to a power supply contact of the integrated circuit device to which ESD currents are to be shunted,
      a first N-doped section comprising a deep N-well structure,
      a second P-doped section comprising a second P-doped well formed within a second region of the epitaxial layer, and
      a second N-doped section comprising an N-doped contact region formed within a surface of the second P-doped well, the second N-doped section coupled to a contact of the integrated circuit device; and
   a P-doped region formed on an upper surface of the deep N-well structure in contact with the second P-doped region of the epitaxial layer such that the P-doped region formed on the upper surface of the deep N-well structure forms a part of the second P-doped section of the first thyristor structure.

2. The ESD protection structure of claim 1 further comprising an isolation region formed on the upper surface of the deep N-well structure and arranged to isolate the P-doped region formed on the upper surface of the deep-N-well structure from the first P-doped section of the first thyristor structure.

3. The ESD protection structure of claim 2, wherein the isolation region comprises a shallow trench isolation region.

4. The ESD protection structure of claim 1, wherein the P-doped region formed on the upper surface of the deep N-well structure comprises a high dopant concentration.

5. The ESD protection structure of claim 1 further comprising an N-doped buried layer formed to vertically isolate at least the second region of the epitaxial layer.

6. The ESD protection structure of claim 1 formed within an isolation trench recessed within the semiconductor substrate of the integrated circuit device.

7. The ESD protection structure of claim 1 further comprising:
   a second thyristor structure being formed from
      a first P-doped section comprising the second P-doped well formed within the second region of the P-doped epitaxial layer, wherein the first P-doped section is coupled to the contact of the integrated circuit device,
      a first N-doped section comprising the deep N-well structure,
      a second P-doped section comprising the first P-doped well formed within the first region of the epitaxial layer, and
      a second N-doped section comprising an N-doped contact region formed within a surface of the first P-doped well, the second N-doped section coupled to the power supply contact of the integrated circuit device to which ESD currents are to be shunted.

8. An integrated circuit device comprising:
   at least one semiconductor substrate comprising at least one electrostatic discharge, ESD, protection structure, wherein the ESD protection structure comprises at least
   a first thyristor structure being formed from
      a first P-doped section comprising a first P-doped well formed within a first region of a P-doped epitaxial layer wherein the first P-doped section is coupled to a power supply contact of the integrated circuit device to which ESD currents are to be shunted,
      a first N-doped section comprising a deep N-well structure,
      a second P-doped section comprising a second P-doped well formed within a second region of the epitaxial layer, and
      a second N-doped section comprising an N-doped contact region formed within a surface of the second P-doped well, the second N-doped section coupled to a contact of the integrated circuit device;
   wherein the ESD protection structure further comprises a P-doped region formed on an upper surface of the deep N-well structure in contact with the second P-doped region of the epitaxial layer such that the P-doped region formed on the upper surface of the deep N-well structure forms a part of the second P-doped section of the first thyristor structure.

9. The integrated circuit device of claim 8, wherein the ESD protection structure further comprises an isolation region formed on the upper surface of the deep N-well structure and arranged to isolate the P-doped region formed on the upper surface of the deep-N-well structure from the first P-doped section of the first thyristor structure.

10. The integrated circuit device of claim 9, wherein the isolation region comprises a shallow trench isolation region.

11. The integrated circuit device of claim 8, wherein the P-doped region formed on the upper surface of the deep N-well structure comprises a high dopant concentration.

12. The integrated circuit device of claim 8, wherein the ESD protection structure further comprises an N-doped buried layer formed to vertically isolate at least the second region of the epitaxial layer.

13. The integrated circuit device of claim 8, wherein the ESD protection structure is formed within an isolation trench recessed within the semiconductor substrate of the integrated circuit device.

14. The integrated circuit device of claim 8, wherein the ESD protection structure further comprising:
   a second thyristor structure being formed from
      a first P-doped section comprising the second P-doped well formed within the second region of the P-doped epitaxial layer wherein the first P-doped section coupled to the contact of the integrated circuit device,
      a first N-doped section comprising the deep N-well structure,
      a second P-doped section comprising the first P-doped well formed within the first region of the epitaxial layer, and
      a second N-doped section comprising an N-doped contact region formed within a surface of the first P-doped well, the second N-doped section coupled to the power supply contact of the integrated circuit device to which ESD currents are to be shunted.

* * * * *